United States Patent [19]
Auer et al.

[11] Patent Number: 5,623,164
[45] Date of Patent: Apr. 22, 1997

[54] INTEGRATED SEMICONDUCTOR CIRCUIT OR MICROMECHANICAL COMPONENT AND PROCESS THEREFORE

[75] Inventors: Stephan Auer, Dachau; Armin Kohlhase, Neubiberg; Hanno Melzner, Unterhaching, all of Germany

[73] Assignee: Siemens Aktiengesellschaft, Munich, Germany

[21] Appl. No.: 360,803

[22] PCT Filed: Jun. 24, 1993

[86] PCT No.: PCT/DE93/00553

§ 371 Date: May 10, 1995

§ 102(e) Date: May 10, 1995

[87] PCT Pub. No.: WO94/00876

PCT Pub. Date: Jan. 6, 1994

[30] Foreign Application Priority Data

Jun. 30, 1992 [DE] Germany ........................... 42 21 432.7

[51] Int. Cl.⁶ .......................... H01L 27/108; H01L 29/92
[52] U.S. Cl. .......................... 257/752; 257/306; 257/758; 257/756
[58] Field of Search .................................. 257/752, 758, 257/756, 753, 298, 306

[56] References Cited

U.S. PATENT DOCUMENTS

| | | | |
|---|---|---|---|
| 5,064,683 | 11/1991 | Poon et al. | 427/39 |
| 5,414,655 | 5/1995 | Ozaki et al. | 257/306 |

FOREIGN PATENT DOCUMENTS

| | | |
|---|---|---|
| 0224646 | 6/1987 | European Pat. Off. . |
| 4221432 | 1/1994 | Germany . |
| 4221431 | 1/1994 | Germany . |
| 3120864 | 8/1987 | Japan . |
| 4082263 | 7/1990 | Japan . |
| 0237059 | 9/1990 | Japan . |
| 3165557 | 10/1991 | Japan . |
| 3190161 | 11/1991 | Japan . |
| 0029487 | 2/1994 | Japan ..................................... 257/306 |

OTHER PUBLICATIONS

IBM Technical Disclosure Bulletin, vol. 33, No. 2, Jul. 1990, "Shallow Trench Planarization Process With Chemical-Mechanical Polish Endpoint", pp. 75–76.

*Primary Examiner*—Sara W. Crane
*Assistant Examiner*—Alexander Oscar Williams
*Attorney, Agent, or Firm*—Hill, Steadman & Simpson

[57] ABSTRACT

For the global planarization of a semiconductor circuit or a micromechanical component with a step between a higher-lying region and a lower-lying region, the regions being large in area, it is envisaged to deposit a first layer (50), remove it again in the higher-lying region apart from a rib (50), deposit a second layer (51) and then, in a CMP step, planarize the entire arrangement.

8 Claims, 2 Drawing Sheets

INTEGRATED SEMICONDUCTOR CIRCUIT OR MICROMECHANICAL COMPONENT AND PROCESS THEREFORE

BACKGROUND OF THE INVENTION

The invention relates to a global planarization process for integrated semiconductor circuits or micromechanical components having large-area regions of various heights and a step to be planarized between a higher-lying region and a lower-lying region, as well as a corresponding arrangement.

In semiconductor technology and in micromechanics (including sensor technology), the problem is known that, during the course of producing the components, there are formed regions of various heights which are relatively large in area (>1000 µm2), the step existing between the regions having to be planarized.

An example of this is that of integrated semiconductor circuits, in which the individual circuit elements such as transistors and capacitors have to be connected to one another with low resistance after their production. This is generally performed with the aid of single-layer or multi-layer metallization patterns, which are produced by depositing a metal layer over the entire surface and subsequently delineating patterns photolithographically to form conductor tracks. For an electrically reliable metallization pattern, it is necessary that, before depositing the metal layer, the underlying surface is as plain as possible, i.e. does not have any sharp edges, and that the difference in height is within the depth of focus of the photolithographic procedure used.

The second condition in particular is often difficult to satisfy when there is increasing integration density of the circuit, since a lateral reduction in size in many cases requires an increase in the vertical dimension. For instance, in the case of DRAM semiconductor memories, to increase the integration density memory cells of the "stacked-capacitor" or "stacked-capacitor-above-bitline" type are used, as are described for example in the article by T. Kaga in IEEE Transactions on ED, volume 38, No. 2, February 1991, page 255, in which the capacitor provided on top causes a step between relatively large-area (order of magnitude 100 µm×100 µm) regions, namely the cell array and the lower-lying periphery containing the wiring. Such a step cannot be smoothed out by conventional, local planarization processes. A particularly high step occurs if, to increase capacitance, a so-called crown capacitor is used.

The metal layer mentioned must provide electrical contact for various conductive structures which are arranged on various levels (for example substrate, wordline level, bitline level, capacitor), by contact holes being etched into an insulating layer separating the metallization pattern and the conductive structures and being filled with a conductive material. It is advantageous if the layer thicknesses of the insulating layer to be etched through in this case are known precisely, in order to avoid lengthy overetching times and to permit so-called "non-nested contacts".

SUMMARY OF THE INVENTION

The object of the invention is to specify a global planarization process for a micromechanical component or an integrated semiconductor circuit, in particular for a semiconductor circuit with stacked-capacitor-above-bitline cells, by which steps between large-area regions can be levelled. It is to be particularly simple to carry out and also to be able to be used in cases of high steps to be planarized.

A further object is to provide a globally planarized integrated semiconductor circuit or a micromechanical component.

In general terms the present invention is a global planarization process for integrated semiconductor circuits or micromechanical components having large-area regions of various heights and a step to be planarized between a higher-lying region and a lower-lying region. A first layer is applied and structured. Subsequently a second layer is applied and thereafter a polishing process is carried out. The process has the following process steps: determining the height of the step by a measurement; applying over the entire surface the first layer in a thickness which corresponds to the measured height of the step; removing the first layer in the higher-lying region with the aid of a photolithographic procedure, the first layer remaining only in a border area of the higher-lying region as a rib; applying over the entire surface the second layer; and levelling the entire surface assigned to the higher-lying and lower-lying regions with the aid of a polishing process.

In a development of the present invention the process further comprises a semiconductor memory arrangement with single-transistor memory cells as an integrated semiconductor circuit; a cell array, containing the memory cells, as a higher-lying region; a periphery, containing the memory cells, as a higher-lying region; a periphery, containing a wiring, as a lower-lying region, the memory cells having a bitline, arranged above the bitline, and the capacitors being arranged on a first isolating layer, covering the cell array and the periphery; a first dielectric as a first layer; a second dielectric as a second layer; and a thickness of the first dielectric corresponding to the height of the capacitors during depositing.

An etching process selective with respect to the material of the underlying region is used for removing the first layer.

In the CMP polishing step, the entire second layer is removed above the rib and only a fraction of the layer thickness of the second layer is removed at the other points.

A silicon oxide layer is deposited as the first and second layer.

Before production of the capacitors, the first isolating layer is globally planarized with the aid of a CMP polishing step.

The present invention is also an integrated semiconductor circuit or micromechanical component with large-area regions of various heights and a step between a higher-lying region and a lower-lying region, which is globally planarized with the aid of a polishing process. There are on the lower-lying region a first layer and a second layer lying thereabove. On the entire higher-lying region with the exception of a border area there is only the second layer. The thickness of the first layer is predetermined by the height of the step between the higher-lying region and the lower-lying region. The entire surface of the semiconductor arrangement assigned to the higher-lying and lower-lying regions is polished and globally planarized.

In a development of the present invention at least in one part of the border area there is only the first layer.

The invention is based on the use of a polishing process (so-called chemical mechanical polishing, CMP) as a global planarization process and on a special combination of CMP with a depositing, photolithographic procedure and etching process. CMP can be used in the case of various materials and is described in more detail in the article by W. J. Patrick et al., J. Electrochem. Soc., volume 138, No. 6, June 1991, page 1778. Until now, however, it has been used with preference in the multilayer wiring of integrated circuits (see for example C. Kaanta et al., VMIC Conference 1991, page 144. Use in the case of micromechanical components and in the production of a globally planarized semiconductor memory arrangement of the present type, in particular for the global planarization of cell array and periphery, is not known. The invention can be used in particular in the case of memory arrangements in which a globally planar surface already exists before production of the capacitor. In the German Patent Applications "Herstellverfahren für eine Halbleiterspeicheranordnung" (Production process for a semiconductor memory arrangement) and "Herstellverfahren für einen Schüsselkondensator" (Production process for a crown capacitor) of the same inventors of 30.6.1992, to the entire content of which reference is made here, corresponding memory arrangements are disclosed.

CMP permits a global, i.e. widespread, planarization of the surface with very low remaining steps (at most about 100 nm). By suitable composition of the polishing fluid, a selectivity between various materials can be achieved. On the other hand, meaningful use of a CMP step in many cases is conditional on the surface already being sufficiently well planarized before the process. Otherwise, high-lying structures would be damaged, whereas undesired residual material would remain over low-lying structures. Further details are explained in the already mentioned German Patent Applications of the same inventors.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

DESCRIPTION OF THE PREFERRED EMBODIMENTS

Figure 1:
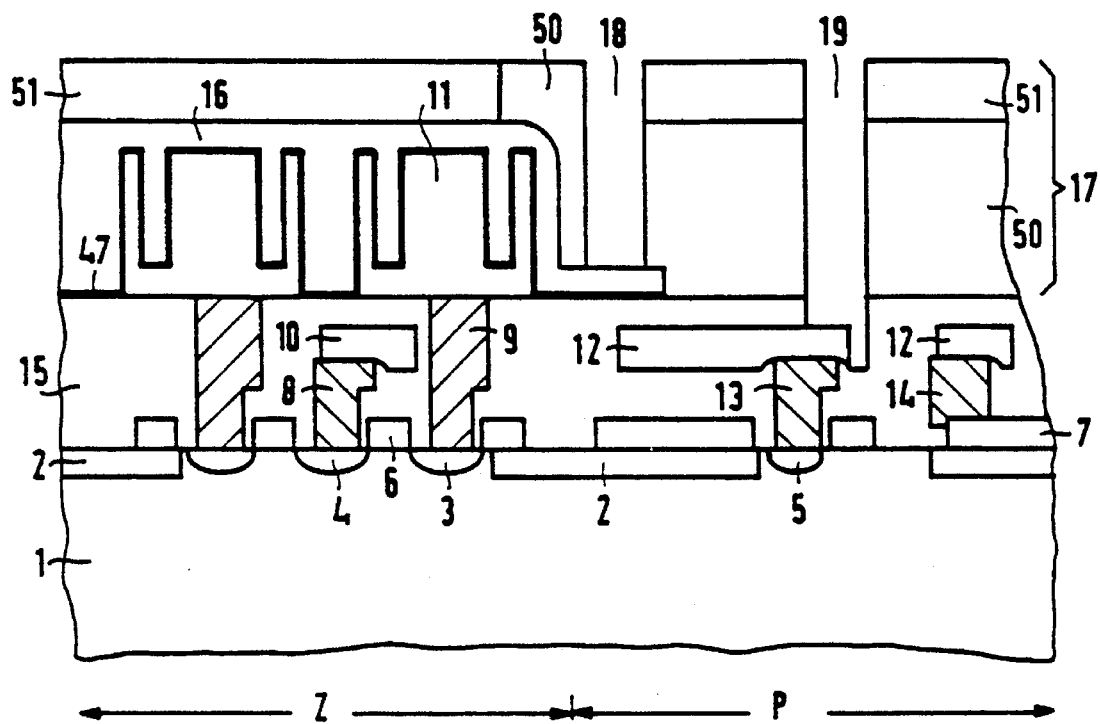
FIG. 1 shows a cross-section through a memory cell and through a cutout of the periphery after carrying out the process according to the invention

FIG. 1: as an example of a planarized component according to the invention, a semiconductor circuit (DRAM memory arrangement) is represented, to be precise a cross-section through two neighboring memory cells at the border of a cell array parallel to the active region and through a typical peripheral circuit is represented, the memory arrangement being complete apart from the production of wiring levels. In a semiconductor substrate 1 there are arranged isolating regions 2, which isolate the various memory cells from one another. The semiconductor substrate 1 contains, furthermore, doped regions 3, 4, 5 as source 3 or drain 4 of transistors in the cell array or in the periphery or as a terminal (5) of the semiconductor substrate 1. On the substrate surface (or on a gate oxide, which is not shown) there are on a wordline level a gate 6 of the transistor and other conducting structures 7. A transistor-bitline pillar 8 (TB pillar) connects the drain region of the transistor to an above-lying bitline 10, a transistor-capacitor pillar 9 (TK pillar) connects the source region 3 to a lower capacitor plate 11. In the periphery, further pillars are provided, which connect conductor tracks 12 lying on the bitline level to the doped substrate region 5 (SB pillars 13) or to the conducting structure 7 on the wordline level (WB pillars 14). The pillars 8, 9, 13, 14, bitline 10 and conductor tracks 12 are arranged in a first isolating layer 15. It is advantageous if the first isolating layer 15 has a globally planarized surface, which lies at the same height as the upper edge of the TK pillars 9.

The capacitor comprises the lower capacitor plate 11, preferably designed as a crown, and a counter-plate 16, which is shared by all the memory cells and is isolated from the lower capacitor plate by a dielectric 47. As the Figure reveals, the cell array represents the higher-lying region and the periphery represents the lower-lying region.

A second isolating layer 17 covers the counter-plate 16 in the cell array, and the first isolating layer 15 in the periphery. Arranged in it are vias 18, 19, via which the counter-plate 16 or the conductor track 12 of the bitline level (and consequently the semiconductor substrate or the wordline level) can be connected. According to the invention, the second isolating layer 17 has a globally planarized surface. The second isolating layer is made up of two part-layers, a first dielectric 50 as a first layer and a second dielectric 51 as a second layer.

Use of the process according to the invention is particularly advantageous in the case of memory arrangements such as are described in the already mentioned German Patent Applications of the same inventors: the structures (16 and 12) to be exposed during the etching of the vias 18 and 19, respectively, are arranged on globally planarized surfaces, meaning that the layer thicknesses to be etched through are precisely defined; in addition, the counter-plate 16 lies in a border strip around the cell array not much higher than the conductor tracks 12, meaning that overetching on the counter-plate is low. This avoids the counter-plate 16 being etched through during the etching of the vias. A suitable single-layer or multi-layer metallization pattern (not shown) serves subsequently for the low-resistance wiring of the switching elements via the vias 18, 19.

Figure 2:
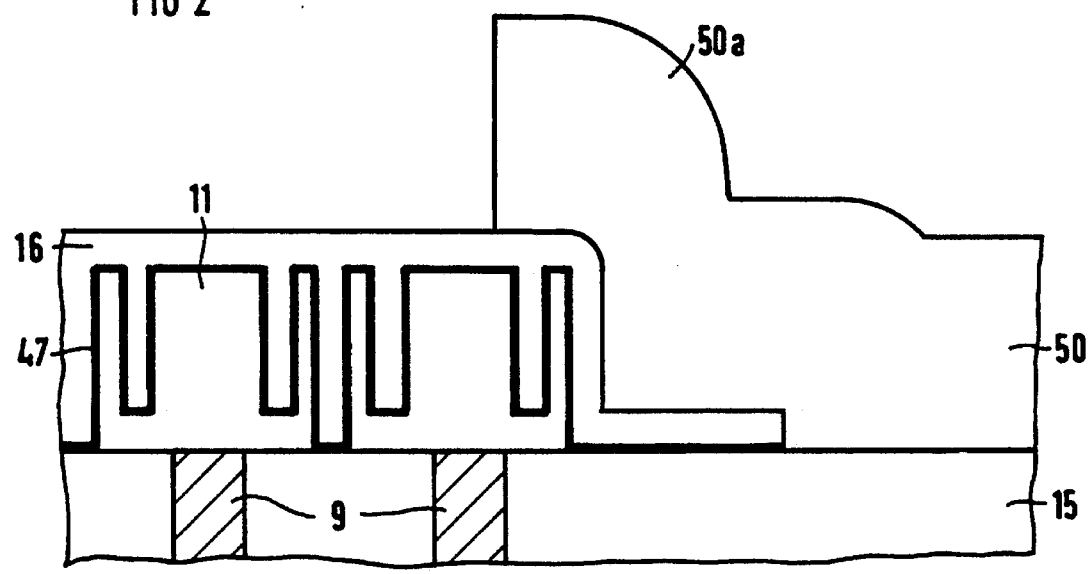
FIGS. 2 to 4 show a cross-section, in cutout form, through the semiconductor substrate at the border of the cell array, by which the process steps of one embodiment of the invention are illustrated.

FIG. 2: after production of the counter-plate 16 by known processes, according to the invention a first layer 50, for example a silicon oxide, is deposited, the thickness of which is precisely the same as the step to be planarized between the cell array as the higher-lying region and the periphery as the lower-lying region. In this case, the layer thickness to be deposited is thus equal to the height of the capacitors (including the counter-plate) 11, 47, 16. In practice, this can be achieved by measuring the height of the capacitors before deposition by means of profilometry and setting the layer thickness to this value. Subsequently, the first dielectric 50 is completely removed again by means of a photolithographic procedure in a suitable etching process in the cell array, a rib 50a remaining at the border of the cell array. In this case, an etching process selective with respect to the material of the counter-electrode, usually polysilicon, is used. Apart from this rib 50a, the surface is then already globally planar. The width of the rib 50a depends substantially on the attainable adjusting accuracy of the photolithographic procedure used and is of the order of magnitude of 1 micrometer.

Figure 3:
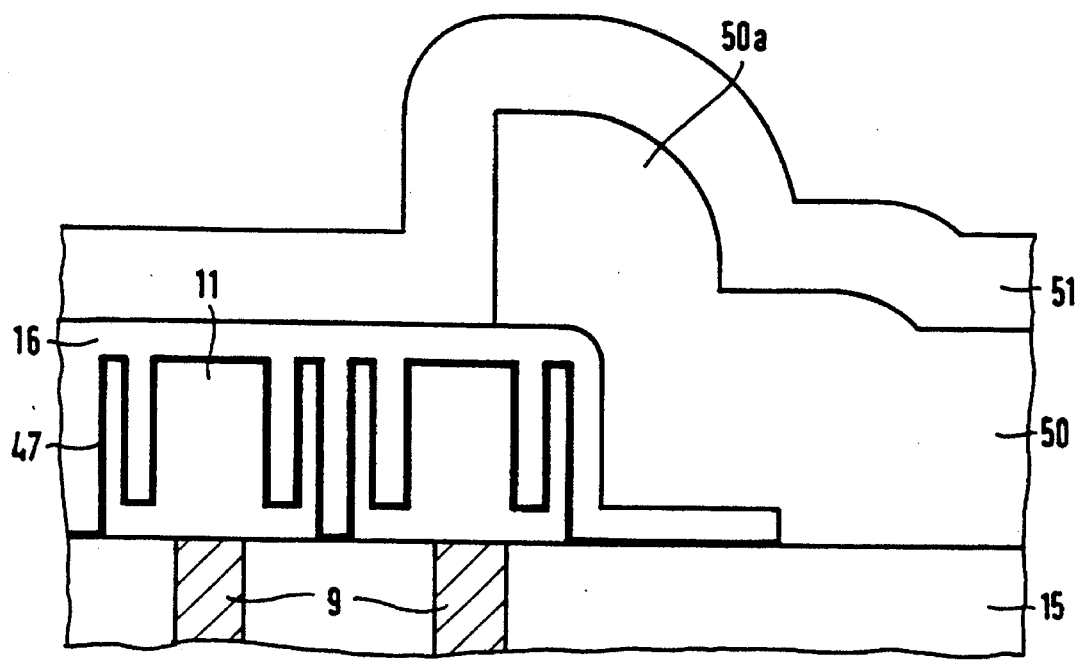

FIG. 3: according to the invention, a second dielectric 51 of about 500 nm thickness, which preferably consists of the same material as the first dielectric 50, is then deposited.

Figure 4:
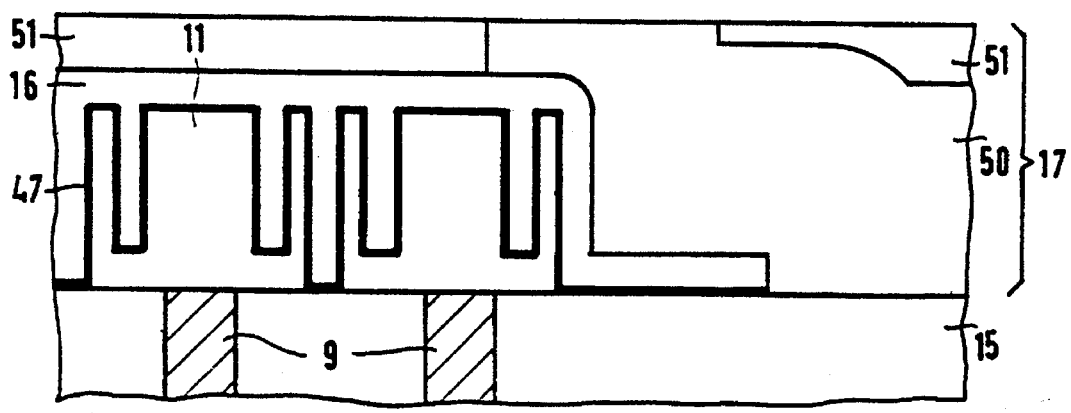

FIG. 4: part of the thickness of this second dielectric 51, for example 200 nm, is removed in a CMP step. Above the ribs 50a it is removed completely, at the same time the rib is also levelled. Thus, the semiconductor memory arrangement then has a globally planarized surface. The polished first and second dielectrics 50, 51 form the part-layers of the second isolating layer 17, into which the vias 18, 19 can subsequently be etched.

The uniformity of the material removal in the CMP step over an entire semiconductor wafer, containing a plurality of memory arrangements, is usually not particularly good. The invention therefore provides a planarizing process in which as little material removal as possible is required in the CMP step. Since the ribs 50a are narrow and have a large distance from one another, they are removed at a high removal rate in the CMP step. A particular advantage of the process according to the invention is that the uniformity during etching of the first dielectric 50, which under certain circumstances is likewise poor, has no influence on the subsequently existing layer thicknesses, since the etching is stopped on the counter-plate 48. Outside the cell array, the layer thickness is substantially determined by to a great extent precisely defined depositions. This is particularly advantageous, since as a result so-called "non-nested" contact holes can be produced in the periphery with respect to the contact tracks on the bitline level (see FIG. 1, contact hole 19), i.e. the contact holes 19 can reach beyond the edge of the conductor track 12, so that the space requirement of the circuit is greatly reduced. With non-nested vias, the problem can arise that the contact hole etching passes beyond the conductor track to the underlying conductor track levels and consequently causes short-circuits between the contact hole filling and these lower conductor tracks. The etching of the contact holes 19 must therefore be terminated early enough, before deeper conductor tracks are reached. On the other hand, of course, each contact hole 19 must reach as far as the conductor track 12. It is thus necessary for the layer thickness of the entire dielectric over the conductor track 12 to be precisely known and to be sufficiently uniform over the semiconductor wafer. This is ensured to a high degree by the global planarization according to the invention.

Depending on the given requirements, in particular in the case of micromechanical components without a direct electrical connection, the first and second layers 50, 51 may also consist of a material other than a dielectric material.

The invention is not limited to the particular details of the method and apparatus depicted and other modifications and applications are contemplated. Certain other changes may be made in the above described method and apparatus without departing from the true spirit and scope of the invention herein involved. It is intended, therefore, that the subject matter in the above depiction shall be interpreted as illustrative and not in a limiting sense.

What is claimed is:

1. A global planarization process for integrated semiconductor circuits or micromechanical components having large-area regions of various heights and a step to be planarized between a higher-lying region and a lower-lying region, in which a first layer is applied and structured, in which subsequently a second layer is applied and thereafter a polishing process is carried out, comprising the steps of:

determining a height of the step by a measurement;

applying over an entire surface the first layer in a thickness which corresponds to the measured height of the step;

removing the first layer in the higher-lying region using a photolithographic procedure, the first layer remaining only in a border area of the higher-lying region as a rib;

applying over an entire surface the second layer; and levelling the entire surface assigned to the higher-lying and lower-lying regions with the aid of a polishing process.

2. The global planarization process according to claim 1, wherein the process further comprises:

a semiconductor memory arrangement with single-transistor memory cells as an integrated semiconductor circuit;

a cell array, containing the memory cells, as a higher-lying region;

a periphery, containing a wiring, as a lower-lying region, the memory cells having a bitline, arranged above a transistor, and a capacitor, arranged above the bitline, and the capacitors being arranged on a first isolating layer, covering the cell array and the periphery;

a first dielectric as a first layer;

a second dielectric as a second layer; and a thickness of the first dielectric corresponding to the height of the capacitors during depositing.

3. The global planarization process according to claim 1, wherein an etching process selective with respect to a material of an underlying region is used for removing the first layer.

4. The global planarization process according to claim 1, wherein in the polishing step, the entire second layer is removed above the rib and only a fraction of the layer thickness of the second layer is removed at other points.

5. The global planarization process according to claim 1, wherein a silicon oxide layer is deposited as the first and second layers.

6. The global planarization process according to claim 2, wherein before production of the capacitors, a first isolating layer is globally planarized using a polishing step.

7. An integrated semiconductor circuit or micromechanical component comprising: large-area regions of various heights and a step between a higher-lying region and a lower-lying region, which is globally planarized using a polishing process; on the lower-lying region a first layer and a second layer lying thereabove; on the entire higher-lying region, with the exception of a border area, only the second layer; the thickness of the first layer being predetermined by a height of the step between the higher-lying region and the lower-lying region; and the entire surface of the semiconductor arrangement assigned to the higher-lying and lower-lying regions being polished and globally planarized.

8. The integrated semiconductor circuit or micromechanical component according to claim 7, wherein at least in one part of the border area there is only the first layer.

* * * * *